(12) United States Patent
Siegert et al.

(10) Patent No.: US 8,004,875 B2
(45) Date of Patent: Aug. 23, 2011

(54) CURRENT MAGNITUDE COMPENSATION FOR MEMORY CELLS IN A DATA STORAGE ARRAY

(75) Inventors: Markus Jan Peter Siegert, Minneapolis, MN (US); Michael Xuefei Tang, Bloomington, MN (US); Andrew John Carter, Minneapolis, MN (US); Alan Xuguang Wang, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 133 days.

(21) Appl. No.: 12/502,212

(22) Filed: Jul. 13, 2009

(65) Prior Publication Data

US 2011/0007550 A1    Jan. 13, 2011

(51) Int. Cl.
*G11C 11/00* (2006.01)

(52) U.S. Cl. .... 365/148; 365/196; 365/100; 365/230.06

(58) Field of Classification Search ........... 365/148, 365/196, 100, 230.06
See application file for complete search history.

(56) References Cited

U.S. PATENT DOCUMENTS

| 5,798,966 | A | 8/1998 | Keeney |
| 6,639,824 | B1 | 10/2003 | Wohlfahrt et al. |
| 6,680,865 | B2 | 1/2004 | Watanabe |
| 7,345,922 | B2 | 3/2008 | Roohparvar |
| 2009/0273961 | A1* | 11/2009 | Ono et al. ............ 365/51 |

* cited by examiner

*Primary Examiner* — Thong Q Le
(74) *Attorney, Agent, or Firm* — Fellers, Snider, et al.

(57) ABSTRACT

A data storage device and associated method for providing current magnitude compensation for memory cells in a data storage array. In accordance with some embodiments, unit cells are connected between spaced apart first and second control lines of common length. An equalization circuit is configured to respectively apply a common current magnitude through each of the unit cells by adjusting a voltage applied to the cells in relation to a location of each of the cells along the first and second control lines.

20 Claims, 5 Drawing Sheets

CURRENT MAGNITUDE COMPENSATION FOR MEMORY CELLS IN A DATA STORAGE ARRAY

BACKGROUND

Solid state memories (SSMs) often comprise one or more arrays of individually programmable memory cells configured to store data by the application of write currents to the cells to store a sequence of bits. The stored bits can be subsequently read during a read operation by applying suitable read currents and sensing voltage drops across the cells.

Some SSM cell configurations employ a resistive sense element coupled to a channel based switching device. The resistive element can be programmed to different resistances to represent different bit states. The switching device provides selective access to the resistive sense element during read and write operations. The cells in an SSM array are often arranged into rows and columns, and are individually accessed by asserting various control lines such as word lines, bit lines and source lines. Some SSM configurations utilize a common source plane in lieu of individual source lines.

A continued trend is to provide SSM arrays with larger data capacities and smaller manufacturing process feature sizes (e.g., F=45 nanometers, nm or F=32 nm, where F is a minimum feature dimension of the associated manufacturing process.). While operable in providing greater data storage capacity and density levels, the use of increasingly larger arrays and/or smaller feature sizes can lead to significant increases in process parameter variations, such as variations in the electrical resistance of the control lines.

Depending on the location of a given cell within an array, it has been found that the electrical resistance of a line from an associated driver to the cell may be substantially equal in magnitude to the programmed resistance of the cell. This can make it difficult to accurately sense the programmed state of the cell, particularly when relatively small magnitudes of sense voltages are used.

SUMMARY

Accordingly, various embodiments of the present invention are generally directed to a data storage device and associated method for compensating for current magnitudes applied to memory cells (unit cells) in a data storage array.

In accordance with some embodiments, the unit cells are connected between spaced apart first and second control lines of common length. An equalization circuit is configured to respectively apply a common current magnitude through each of the unit cells by adjusting a voltage in relation to a location of each of the unit cells along the first and second control lines.

These and other features and advantages which characterize the various embodiments of the present invention can be understood in view of the following detailed discussion and the accompanying drawings.

DETAILED DESCRIPTION

The present disclosure generally relates to the transfer of data to and from a memory space, and in particular to compensating for different magnitudes of current that may be applied to the memory cells in a data storage array during read and write operations. Prior art memory arrays often cannot reliably regulate the amount of current applied to groups of memory cells at different locations in an array for a number of reasons, such as variations in the electrical resistance of control lines connected to the cells.

Accordingly, a data storage device compensation architecture and methodology is disclosed herein that, as explained below, connects unit cells between spaced apart first and second control lines of common length. An equalization circuit is configured to respectively apply a common current magnitude through each of the unit cells by adjusting a voltage in relation to a location of each of the unit cells along the first and second control lines.

Figure 1:
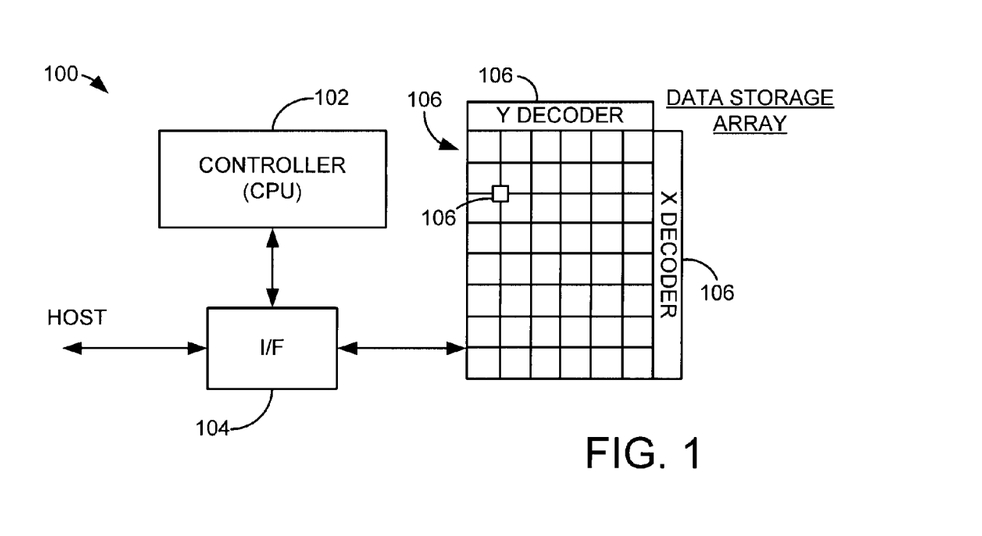
FIG. 1 is a general representation of an exemplary circuitry used to read and write data to a memory device as constructed and operated in accordance with various embodiments of the present invention.

Turning to the drawings, FIG. 1 provides a functional block representation of a data storage device 100 constructed and operated in accordance with various embodiments of the present invention. The device 100 includes a top level controller 102, an interface (I/F) circuit 104 and a data storage array 106. The I/F circuit 104 operates under the direction of the controller 102 to transfer user data between the array 106 and a host device (not shown).

In some embodiments, the device is characterized as a solid-state drive (SSD), the controller 102 is a programmable microcontroller, and the array 106 comprises an array of nonvolatile memory cells 108. In other embodiments, the data storage array 106 can have separate X and Y decoders 110 and 112, respectively, to provide access to selected memory cells 108. However, the configuration and operation of the various components of the data storage device 100 are not required or limited and can be modified, as desired.

Figure 2:
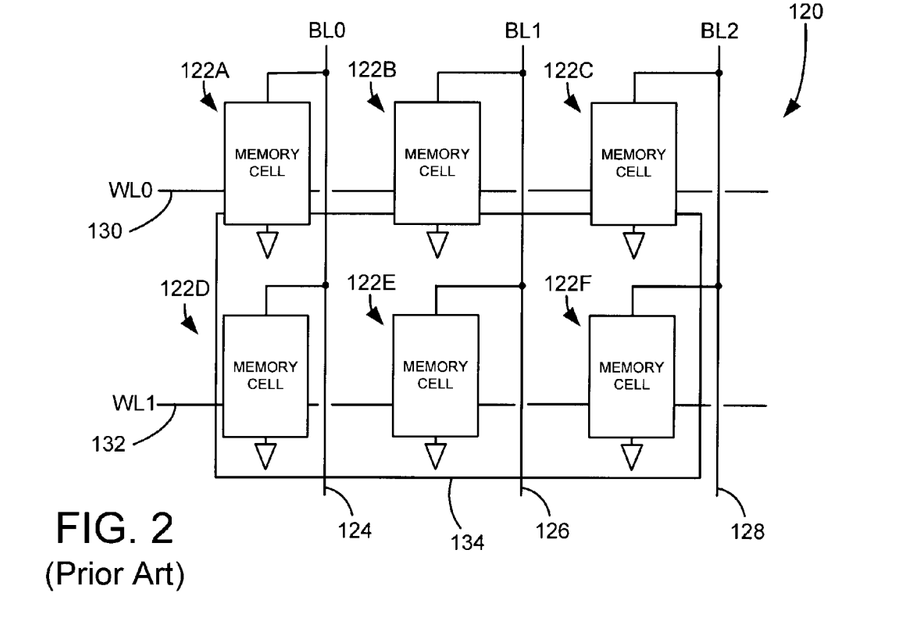
FIG. 2 displays an exemplary prior art data storage array.

FIG. 2 shows a prior art data storage array 120 that incorporates a number of memory (unit) cells, denoted as 122A-F. A plurality of control lines are provided to access the cells, including first, second, and third bit lines BL0 124, BL1 126, and BL2 128, first and second word lines WL0 130 and WL1 132, and a source plane 134 ($V_L$). Each memory cell 122 is connected directly with the source plane 134 while being controlled by the respective bit and word lines.

To carry out an access operation upon a selected memory cell such as the memory cell 122A, the associated bit line BL1 and word line WL1 are charged up to selected voltage potentials, such as $V_{DD}$. A read or write current can then be induced to flow from the bit line BL1, through the cell memory element 122A and into the source plane 134. While operable, certain disadvantages are associated with such operation, particularly for relatively large arrays or arrays of relatively small feature sizes (e.g., F=45 nm or 32 nm).

In such cases, the electrical resistance of the bit lines increases dramatically and the resistance of the entire line can reach the same order of magnitude as the memory cell itself. This leads to significant upstream voltage drops across the bit lines, especially for cells located far away from the bit line driver. For example, for a given bit line voltage the memory cell 122A will experience a significantly higher voltage as compared to the memory cell 122D, due to the differences in the electrical resistance of the bit line.

Figure 3:
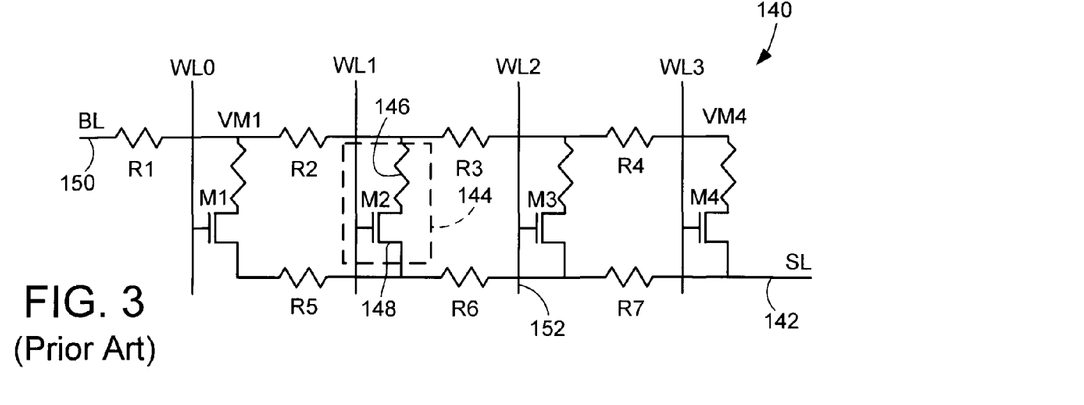
FIG. 3 shows an exemplary prior art row of memory cells.

FIG. 3 shows another prior art data storage array 140 that utilizes individual source lines (SL) 142 rather than a common source plane 134 as shown in FIG. 2. The source lines 142 interconnect a number of memory cells 144 along each row (or column) in the array 140. The memory cells 144 are denoted as M1-M4, and each includes a resistive sense element 146 connected to a switching device 148, such as a metal oxide semiconductor field effect transistor (MOSFET). Bit lines (BL) are denoted at 150 and word lines WL0-WL3 are denoted at 152. The electrical resistance of respective portions of the source lines 142 and bit lines 150 are represented by individual resistors R1-R7.

The lengths and resistances of the source lines 142 and bit lines 150 can be standardized so that the series resistance at each memory cell is substantially equal. In this way, the voltage drop at each memory cell 144 can be made to be substantially the same. For example, it can be seen that for a given current I supplied to the bit line 150, a voltage drop VM1 across the memory cell M1 can be expressed as:

$$VM1=I(R1)+I(R5+R6+R7)=I(R1+R5+R6+R7) \quad (1)$$

while a voltage drop VM4 across the memory cell M4 can be expressed as:

$$VM4=I(R1+R2+R3+R4) \quad (2)$$

If R1=R2=R3=R4=R5=R6=R7, then VM1 will substantially equal VM4. Thus, by providing a bit line 142 and source line 144 with a common resistance per length, the data storage array 140 can use the same bit line voltage to access each the respective memory cells 146.

However, one limitation with this arrangement is the source potential of the transistors 148 of the various memory cells 146, which will vary significantly depending on location along the respective bit and source lines. For example, the source voltage of the transistor 148 of memory cell M4 will be substantially at ground potential, whereas the source voltage of the transistor 148 of memory cell M1 will be at a voltage substantially equal to V=I(R5+R6+R7). The transistor 148 of memory cell M4 will thus drive considerably more current than the transistor 148 of memory cell M1 if the same gate voltage is applied to the respective transistor gates via word lines WL0 and WL3.

This can lead to a number of problems during operation. The provision of widely different magnitudes of current through the various cells along the same row (or column) can interfere with reliable read and write operations upon the cells. For example, if the source potential is too high, insufficient write current may be presented to a particular cell so that a desired programmed state may not be obtained. Similarly, the application of too much write current may, in some cases, present a possibility of damage to the device through overheating. Excessively high write currents may also lead to other deleterious effects, such as excessive power consumption and ultimately, reduced battery life.

Some devices read the programmed state of a cell by applying a relatively small read bias current to the cell, sensing the associated voltage drop across the cell, and using a sense amplifier to compare the voltage drop to a suitable reference voltage. Wide variations in the amounts of current flowing through individual memory cells responsive to the application of a given bit line voltage may adversely affect the ability to correctly discriminate the programmed states of the cells.

Accordingly, by compensating for differences in resistance along a row by adjusting voltage, a common current can be applied to each unit cell which reduces processing time and power consumption. In contrast, differences in resistances among unit cells along a row due to various causes such as control line resistance can increase the amount of processing time and power needed to conduct common data access operations. The operation of a equalization circuit capable of independently adjusting the resistance and voltage of unit cells along a row further allows for advantageous data access operations.

Figure 4:
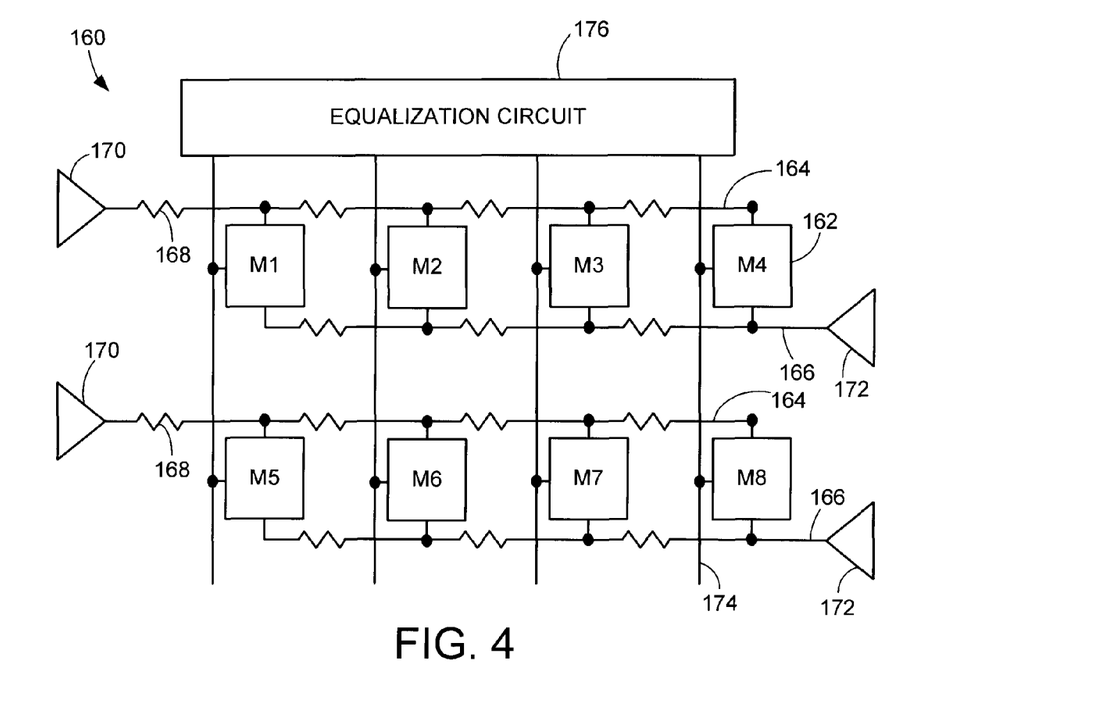
FIG. 4 generally illustrates a compensation architecture constructed and operated in accordance with various embodiments of the present invention.

FIG. 4 provides an exemplary data storage array (device) 160 constructed and operated in accordance with various embodiments of the present invention. The array 160 operates to compensate for different memory cell source potentials to provide a common current magnitude to each of a plurality of unit cells 162 (memory cells). The exemplary cells are denoted in FIG. 4 as M1-M8.

The memory cells 162 are arranged into rows and columns, and may have a form as set forth in FIG. 3 or may take some other form. First and second control lines 164 and 166 respectively interconnect the memory cells along each row. It is contemplated that the control lines 164, 166 have substantially the same common length and resistance per unit length. The associated parasitic resistance of each control line per length is represented by resistors 168, all of which have the same resistance level.

Drivers 170, 172 are configured to respectively direct read and write currents through each of the cells in turn in opposing directions. In some embodiments, the first control lines 164 are characterized as a plurality of spaced apart bit lines which extend across the top of the array for topside interconnection with the memory cells, and the second control lines 166 are characterized as a plurality of spaced apart source lines which extend underneath the array for bottom side interconnection with the memory cells. It is contemplated that the bit lines are parallel to the source lines and both extend in the same direction across the array.

Select lines 174 run in a transverse direction to the bit and source lines, and are coupled to each of the memory cells 162 along each column. In some embodiments, the select lines 174 are characterized as word lines which interconnect the gate regions of switching devices in the memory cells, as in FIG. 3.

An equalization circuit 176 includes respective drivers to apply variable gate voltages to the select lines 174. The gate voltages are supplied in relation to the relative locations of the unit cells along the first and second control lines 164, 166, as well as in relation to the direction of current through the unit cells. The equalization circuit 176 can incorporate the bit and source line drivers 170, 172 as desired.

When an access operation is carried out upon memory cell M1 for a current direction that flows from driver 170 to driver 172, a first gate voltage will be provided to the associated select line 174 by the equalization circuit 176. This first gate voltage will place the memory cell M1 into a conductive state, allowing a read or write current to pass from the driver 170, along the first control line 164, through the memory cell M1, along the second control line 166, and to the driver 172. While the first gate voltage will also be applied to the gate of memory cell M5 (as well as any other memory cells along that column), the associated control lines for the memory cell M5 will be deactivated (such as the same potential, e.g. ground), so substantially no current will flow through memory cell M5 during the access operation upon M1.

It is contemplated that the switching device in M1 will be operated in its linear range (e.g., not saturated), so that the magnitude of current that flows through M1 will be regulated by the gate voltage supplied by the equalization circuit 176 to a desired, predetermined level.

To carry out an access operation upon memory cell M4 in the same current direction, the equalization circuit 176 will apply a different, second gate voltage to the associated word line 174. Because of the lower source potential of the switching device in M4 due to its proximity to the driver 172, the second gate voltage will be lower than the first gate voltage. In this way, the respective access currents supplied through M1 and M4 will be maintained at the same predetermined level (i.e., will have a common current magnitude).

Figure 5:
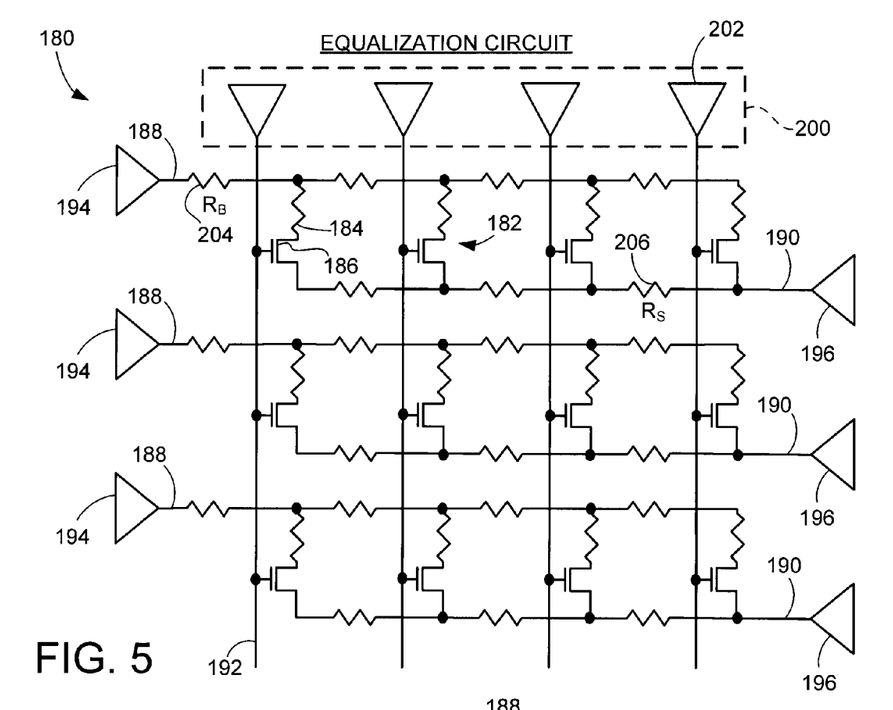
FIG. 5 provides an exemplary compensation architecture constructed and operated in accordance with various embodiments of the present invention.

FIG. 5 provides another exemplary data storage device 180 constructed and operated in accordance with various embodiments of the present invention. Unit cells 182 are arranged into rows and columns, and each include a resistive sense element (RSE) 184 coupled to a MOSFET switching device 186. The cells 182 are interconnected by control lines 188, 190 and select lines 192. As before, drivers 194, 196 direct read and write currents along the respective control lines 188, 190 in the appropriate directions to carry out read and write operations upon the memory cells 182.

An equalization circuit 200 utilizes respective drivers 202 to apply different gate voltages to the gates of the MOSFETs 186 in relation to the location of the memory cells along the control lines 188, 190, as well as in relation to the direction of the read and write currents through the cells. In this way, the equalization circuit 200 provides a common current magnitude through each of the memory cells for a given type of operation.

As before, the control lines 188, 190 are contemplated as being of the same common length and having substantially the same resistance per length. The parasitic resistances of the control lines 188 (bit lines) are represented by resistors $R_B$ 204, and the parasitic resistances of the control lines 190 (source lines) are represented by resistors $R_S$ 206.

In some embodiments, the values of the resistors 204, 206 are nominally the same (i.e., $R_B=R_S$). In other embodiments, the resistors 206 of the source lines 190 are reduced slightly in value with respect to the resistance of the resistors 204 of the bit lines 188, such as within 5% (e.g., $0.95 R_B=R_S$). The use of a slightly reduced $R_S$ resistance further aids in the equalization of the current magnitudes through the respective cells, since the range of source potentials for the MOSFETs 186 will be slightly less through the use of reduced source resistances.

It should be noted that while the various RSEs 184 are not limited to a certain size, orientation, or type, in some embodiments the RSEs will constitute bidirectional memory elements that can be set to a first resistive state by current traveling in a first direction through each cell and a second resistive state by current traveling in a second direction through each cell opposite the first direction. While some embodiments contemplate that all of the memory cells 182 will be subjected to a common current magnitude (such as a given read current for programmed state sensing), it is further contemplated that different current magnitudes may be supplied for the memory cells along each row (or each column).

Figure 6:
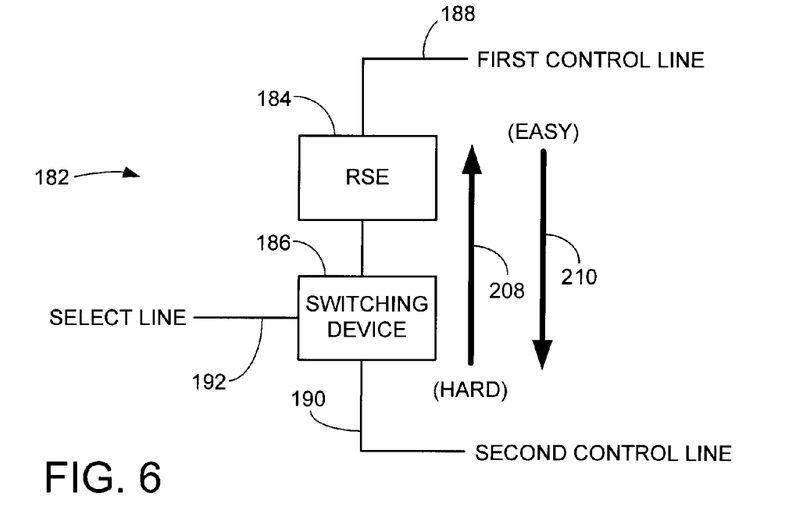
FIG. 6 generally illustrates functional block diagram illustrating operation of various embodiments of the present invention.

FIG. 6 shows a selected unit cell 182 from FIG. 5. When bidirectional memory cells are utilized, the RSE 184 can exhibit asymmetric write characteristics, in that a greater driver effort can be required to switch to some programmed states as compared to other programmed states. For example, FIG. 6 identifies a hard programming direction for the RSE 182 by arrow 208, and an easy programming direction for the RSE by arrow 210. The hard direction 208 corresponds to the direction of current flow from the second control line 190 to the first control line 188, and the easy direction 210 flows current in the opposite direction from the first control line 188 to the second control line 190.

Figure 7A:
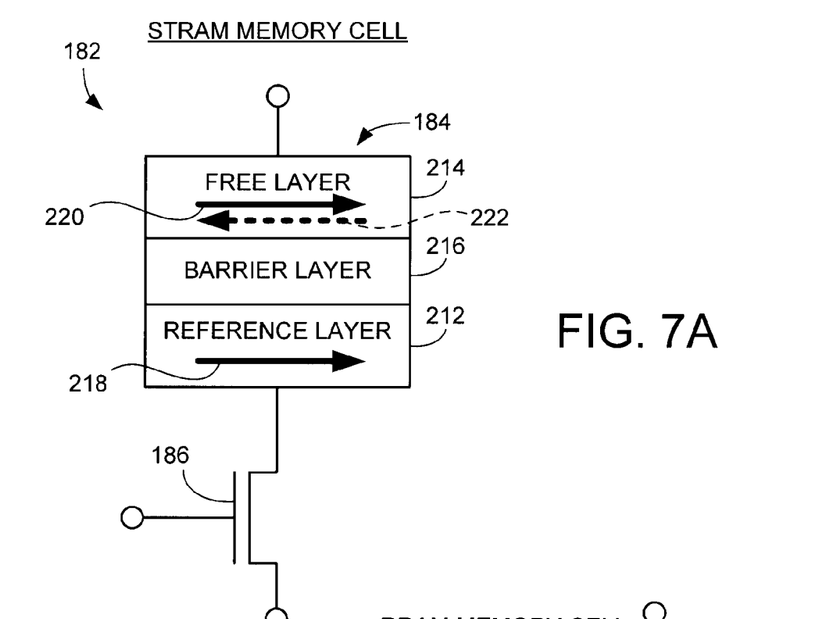
FIG. 7A generally illustrates an exemplary spin torque transfer random access memory (STRAM) cell.

The differences between the hard and easy directions can relate to characteristics of the RSE 184. By way of illustration, FIG. 7A shows the unit cell 182 of FIG. 6 with a spin-torque transfer random access memory (STRAM) configuration. The RSE 184 is characterized as a magnetic tunneling junction (MTJ) with a fixed reference layer 212 and a programmable free layer 214 (recording layer) separated by an intervening tunneling (barrier) layer 216. The reference layer 212 has a fixed magnetic orientation in a selected direction, as indicated by arrow 218. This fixed magnetic orientation can be established in a number of ways, such as via pinning to a separate magnet (not shown).

The free layer 214 has a selectively programmable magnetic orientation that can be parallel (solid arrow 220) or anti-parallel (dotted arrow 222) with the selected direction of the reference layer 212. Other respective magnetization orientations can be used, as desired.

A low resistance state for the RSE 184 is achieved when the magnetization of the free layer 214 is oriented to be substantially in the same direction (parallel) as the magnetization of the reference layer 212. To orient the RSE 184 in the parallel low resistance state, a write current passes through the RSE so that the magnetization direction of the reference layer 212 sets the magnetic orientation of the free layer 214. Since electrons flow in the direction opposite to the direction of current, the write current direction passes from the free layer 214 to the reference layer 212, and the electrons travel from the reference layer to the free layer.

A high resistance state for the RSE 184 is established in the anti-parallel orientation in which the magnetization direction of the free layer 214 is substantially opposite that of the reference layer 212. To orient the RSE 184 in the anti-parallel resistance state, a write current passes through the RSE from the reference layer 212 to the free layer 214 so that spin-polarized electrons flow into the free layer in the opposite direction. It has been found that writing to the anti-parallel state can require greater driver effort, including a larger magnitude of write current, as compared to writing to the parallel state.

Figure 7B:
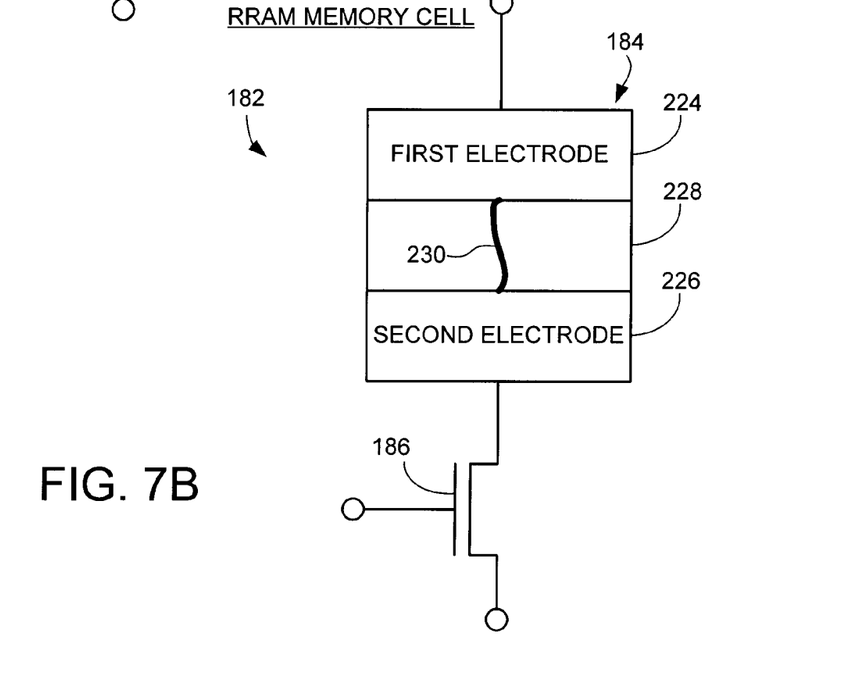
FIG. 7B generally illustrates an exemplary resistive random access memory (RRAM) cell.

FIG. 7B shows the unit cell 182 of FIG. 6 with a resistive random access memory (RRAM) configuration. The RSE 184 is formed from opposing metal or metal alloy electrode layers 224, 226 separated by an intervening oxide layer 228. The oxide layer 228 normally provides the RSE with a high resistive state.

Application of a suitable programming voltage across the RSE induces metal migration from one or both of the electrodes 224, 226, resulting in the formation of one or more conductive filaments 230 that extend across the oxide layer 228. The filament(s) significantly reduce the resistance of the RSE 184 to a second, low resistive state. The filament(s) can be retracted by the application of a second programming voltage opposite the first voltage, thereby returning the RSE to its initial, high resistance state. It has been found that some RRAM configurations can require greater write effort in programming the RSE to one state as compared to the other.

The relative ordering of the RSE 184 and the switching device 186 within the unit cell 182 can also induce write current asymmetries. With reference again to FIG. 6, it is noted that the easy direction 210 passes current through the RSE 184 prior to passing through the switching device 186, so that the voltage at the RSE is equal to the voltage of the first control line (bit line) 188. By contrast, in the hard direction 208 the current passes through the switching device 186 prior to passing through the RSE 184, so that the voltage at the RSE is reduced in relation to the voltage across the switching device.

Thus, the equalization circuits disclosed herein, such as the circuit 176 in FIG. 4 and the circuit 200 in FIG. 5, can be configured to obtain common current magnitudes by providing different gate voltages in relation to location of the memory cell (e.g., physical distance from driver), direction of current (e.g., from BL to SL or SL to BL), the type of access operation (e.g., a read operation or a write operation), and whether the current is being driven in the hard or easy direction through the selected cell. While in some embodiments generally the same voltages will be applied to the respective control lines, in other embodiments variations in control line voltages can also be supplied in view of the foregoing factors.

In some embodiments, voltage level values for each cell can be empirically derived or otherwise calculated, stored in a table and then referenced as required when a particular access operation is being carried out on a particular memory cell. In some embodiments, the values can be supplied to a digital to analog converter (DAC) to adjust the respective select line and/or control line drivers.

Figure 8:
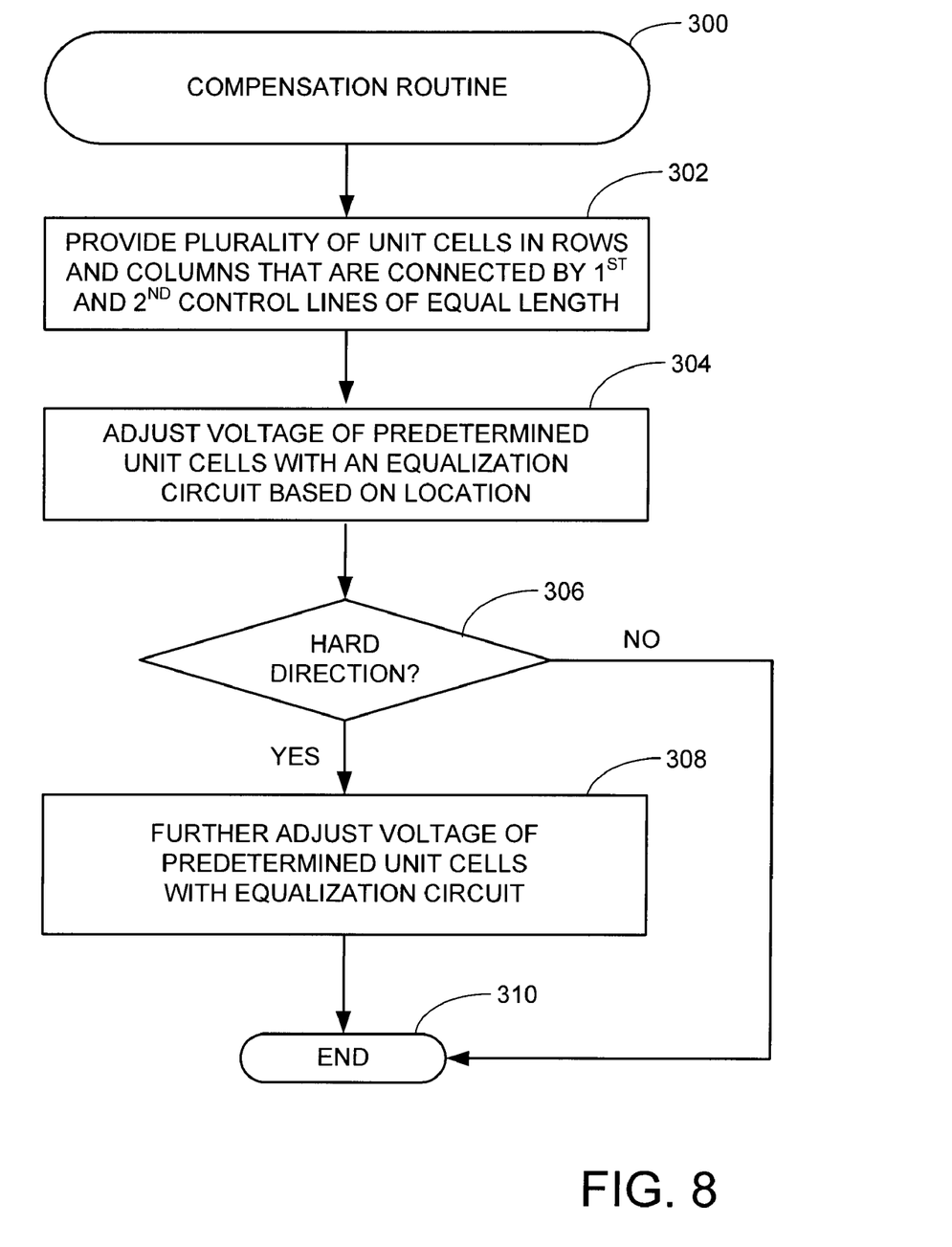
FIG. 8 provides a flowchart of an exemplary COMPENSATION ROUTINE carried out in accordance with various embodiments of the present invention.

FIG. 9 provides a flow chart for a COMPENSATION ROUTINE 300, generally illustrative of steps carried out in accordance with various embodiments of the present invention. At step 302, a plurality of unit cells are arranged in rows and columns that are connected by first and second control lines. In various embodiments, the columns of unit cells are connected by equalization (select) lines connected to an equalization circuit and the first and second control lines are substantially the same length. In addition, each unit cell can comprise an RSE coupled to a switching device that is controlled by the equalization lines.

The matching of the lengths of the first and second control lines can provide an equal series resistance at each unit cell, but generally may not fully compensate for varying source potentials experienced by the switching devices depending on the location along the row and the other factors discussed above. The voltage of predetermined unit cells are thus subsequently adjusted with an equalization circuit in step 304 to allow a common current to be applied to each of the unit cells along the row.

Decision step 306 then determines whether the direction of the current through the predetermined unit cell would be in the hard direction that could contribute to a higher voltage drop across the unit cell. If the predetermined unit cell would have current pass in the hard direction, step 308 further adjusts the voltage of the predetermined unit cell with the equalization circuit so that the common current can be applied to all the unit cells in the row. However, if the predetermined unit cell will not receive current in the hard direction, the compensation routine can pass to completion at step 310 while retaining the ability to apply a common current to each unit cell along a row.

It should be noted that the steps of the compensation routine 300 are merely illustrative not limited; for example, the routine shows separate adjustments for location and direction (hard or easy), but this is merely to illustrate various factors taken into account by the exemplary equalization circuits set forth herein. In some embodiments, a determination is made of all of the relevant factors associated with a particular access operation and a single, associated voltage is output in response.

As can be appreciated by one skilled in the art, the various embodiments illustrated herein provide advantages in both data storage device efficiency and complexity due to the elimination of technically challenging and erratic operations. The equalization circuit allows for more precise data access operations with more consistent operating parameters. Moreover, data access accuracy can be greatly improved by reducing the complexity associated with the various data read and write methods. However, it will be appreciated that the various embodiments discussed herein have numerous potential applications and are not limited to a certain field of electronic media or type of data storage devices.

For purposes of the appended claims, consistent with the foregoing discussion the terms "common length," "common electrical resistance per length" and "common current magnitude" will each be understood to encompass a range of about ±5% of a nominal value. For example, two lines will be considered to have a common length if the two lines have lengths that are within ±5% of each other, and so on.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A data storage device comprising:
unit cells each comprising a resistive sense element and a switching device connected in series, each unit cell connected between spaced apart first and second control lines of common length; and
an equalization circuit configured to respectively apply a common current magnitude through each of the unit cells by adjusting a gate voltage of a gate region of each switching device in relation to a location of each of the unit cells along the first and second control lines.

2. The device of claim 1, wherein each of the first and second control lines have a common electrical resistance per length.

3. The device of claim 1, wherein the first control line has a first electrical resistance per length, and the second control line has a second electrical resistance per length less than the first electrical resistance per length.

4. The device of claim 1, wherein the equalization circuit applies different voltages to the switching devices of the unit cells in relation to the respective locations of the unit cells along the first and second control lines.

5. The device of claim 1, wherein the common current magnitude is achieved by adjusting the gate voltage of the switching device of each unit cell with the equalization circuit for both a hard and easy programming direction of the resistive sense element.

6. The device of claim 1, wherein the equalization circuit comprises a first driver circuit which applies a first voltage to the first control line so that current flows along the first control line, through a selected unit cell and along the second control line at said common current magnitude.

7. The device of claim 6, wherein the equalization circuit further comprises a second driver circuit which applies a second voltage to the gate region of a switching device of the selected unit cell having a magnitude selected in relation to a distal length along the first control line between the first driver circuit and the selected unit cell.

8. The device of claim 1, wherein the common current magnitude is characterized as a common magnitude of read current that is separately applied to each of the unit cells in turn to sense a programmed state of said unit cells.

9. The device of claim 1, further comprising a first driver configured to respectively apply current through the unit cells from the first control line to the second control line, and a second driver circuit configured to respectively apply current through the unit cells from the second control line to the first control line.

10. A data storage device, comprising:
unit cells each comprising a resistive sense element having hard and easy programming directions and a switching device connected in series, each unit cell connected between spaced apart first and second control lines, wherein a series electrical resistance of the first control line and the second control line for each of the unit cells is substantially equal; and
an equalization circuit configured to apply current having a common magnitude through each of the unit cells in turn in both an easy and hard programming direction by adjusting a gate voltage of a gate region of each switching device in relation to a location of each of the unit cells along the first and second control lines.

11. The device of claim 10, wherein the equalization circuit further adjusts said voltage in relation to a direction of said current through each of the unit cells.

12. The device of claim 10, wherein the equalization circuit applies different voltages to the switching devices of the unit cells in relation to the respective locations of the unit cells along the first and second control lines.

13. The device of claim 10, further comprising a first driver configured to respectively apply current through the unit cells from the first control line to the second control line, and a second driver circuit configured to respectively apply current through the unit cells from the second control line to the first control line.

14. The device of claim 10, wherein the unit cells are arranged along a selected row of a data storage array comprising a plurality of rows and a plurality of columns, wherein the first control line is characterized as a first bit line connected to the selected row, wherein the second control line is characterized as a second bit line connected to the selected row, wherein a plurality of word lines are connected to the unit cells along each column in the array, and wherein the adjusted voltage is respective applied to the plurality of word lines in turn.

15. A method comprising:
applying a common current magnitude in turn through each of a plurality of unit cells connected between spaced apart first and second control lines of common length by adjusting a gate voltage applied to a gate region of a switching device of at least one unit cell of said plurality in relation to a location of the at least one unit cell along the first and second control lines.

16. The method of claim 15, wherein the common current magnitude is achieved by adjusting a gate voltage of the switching device of each unit cell based on the location of the unit cell along said first and second control lines.

17. The method of claim 15, wherein an equalization circuit adjusts the voltage applied to at least one unit cell and comprises a driver circuit which applies the voltage to a gate region of a switching device of a selected unit cell, the voltage having a magnitude selected in relation to a distal length along the first control line between the first driver circuit and the selected unit cell.

18. The method of claim 15, wherein the common current magnitude is characterized as a common magnitude of read current that is separately applied to each of the unit cells in turn to sense a programmed state of said unit cells.

19. The method of claim 15, wherein each unit cell has a resistive sense element connected to a switching device, wherein the adjusted voltage is applied to the gate region of the switching device throttles the common current passing through the switching device of the at least one unit cell.

20. The method of claim 19, wherein each resistive sense element is characterized as a bidirectional element in which a first resistive state is written by passing a first current from the first control line to the second control line and in which a different, second resistive state is written by passing a second current from the second control line to the first control line, and wherein the voltage is further adjusted in relation to the direction of the first or second current.

\* \* \* \* \*